United States Patent
Itaya et al.

(10) Patent No.: US 7,501,739 B2
(45) Date of Patent: Mar. 10, 2009

(54) THIN FILM PIEZOELECTRIC RESONATOR AND MANUFACTURING PROCESS THEREOF

(75) Inventors: Kazuhiko Itaya, Tokyo (JP); Takashi Kawakubo, Tokyo (JP); Kenya Sano, Tokyo (JP); Ryoichi Ohara, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 313 days.

(21) Appl. No.: 11/115,158

(22) Filed: Apr. 27, 2005

(65) Prior Publication Data

US 2005/0248232 A1 Nov. 10, 2005

(30) Foreign Application Priority Data

Apr. 30, 2004 (JP) ............................. 2004-136135

(51) Int. Cl.
H01L 41/08 (2006.01)
(52) U.S. Cl. .................... 310/320; 310/365; 310/321; 310/324
(58) Field of Classification Search ................ 310/324, 310/320–321, 365
See application file for complete search history.

(56) References Cited

U.S. PATENT DOCUMENTS

| | | | | |
|---|---|---|---|---|
| 4,502,932 A | * | 3/1985 | Kline et al. | 204/192.18 |
| 5,692,279 A | * | 12/1997 | Mang et al. | 29/25.35 |
| 5,873,154 A | * | 2/1999 | Ylilammi et al. | 29/25.35 |
| 6,217,979 B1 | * | 4/2001 | Takeuchi et al. | 428/138 |
| 6,291,931 B1 | * | 9/2001 | Lakin | 310/364 |
| 6,617,751 B2 | * | 9/2003 | Sunwoo et al. | 310/312 |
| 7,098,575 B2 | * | 8/2006 | Mehta | 310/324 |
| 2001/0017504 A1 | * | 8/2001 | Aigner et al. | 310/330 |
| 2002/0079986 A1 | * | 6/2002 | Ruby et al. | 333/187 |
| 2003/0048046 A1 | * | 3/2003 | Yamaguchi et al. | 310/358 |
| 2003/0076007 A1 | * | 4/2003 | Murai | 310/324 |
| 2005/0248232 A1 | | 11/2005 | Itaya et al. | |
| 2006/0125489 A1 | * | 6/2006 | Feucht et al. | 324/633 |
| 2008/0024041 A1 | * | 1/2008 | Shibata | 310/340 |
| 2008/0169884 A1 | * | 7/2008 | Matsumoto et al. | 333/187 |

FOREIGN PATENT DOCUMENTS

| | | |
|---|---|---|
| JP | 60-149215 | 8/1985 |
| JP | 09064675 A * | 3/1997 |

(Continued)

OTHER PUBLICATIONS

T. Nishihara, et al., "High Performance and Miniature Thin Film Bulk Acoustic Wave Filters for 5 GHz", IEEE Ultrasonics Symposium, 2002, pp. 944-947.

(Continued)

Primary Examiner—Jaydi SanMartin
(74) Attorney, Agent, or Firm—Oblon, Spivak, McClelland, Maier & Neustadt, P.C.

(57) ABSTRACT

A thin film piezoelectric resonator includes a substrate having a cavity, and a resonance portion located on the substrate and right above the cavity. The resonance portion includes a lower electrode layer located at a side of the cavity, an upper electrode layer opposite to the lower electrode layer, and a piezoelectric thin film located between the upper electrode layer and the lower electrode layer. A side of the piezoelectric thin film and a side of the lower electrode layer are located in a common plane.

11 Claims, 14 Drawing Sheets

FOREIGN PATENT DOCUMENTS

| | | |
|---|---|---|
| JP | 10-126160 | 5/1998 |
| JP | 2001-203558 | 7/2001 |
| JP | 2001203558 A * | 7/2001 |
| JP | 2001-211053 | 8/2001 |
| JP | 2002-76824 | 3/2002 |
| JP | 2002-151754 | 5/2002 |
| JP | 2003-17964 | 1/2003 |
| JP | 2003-505906 | 2/2003 |
| JP | 2003-163566 | 6/2003 |
| JP | 2003-318695 | 11/2003 |
| WO | WO 2004017063 A2 * | 2/2004 |

OTHER PUBLICATIONS

U.S. Appl. No. 11/923,117, filed Oct. 24, 2007, Sano, et al.

* cited by examiner

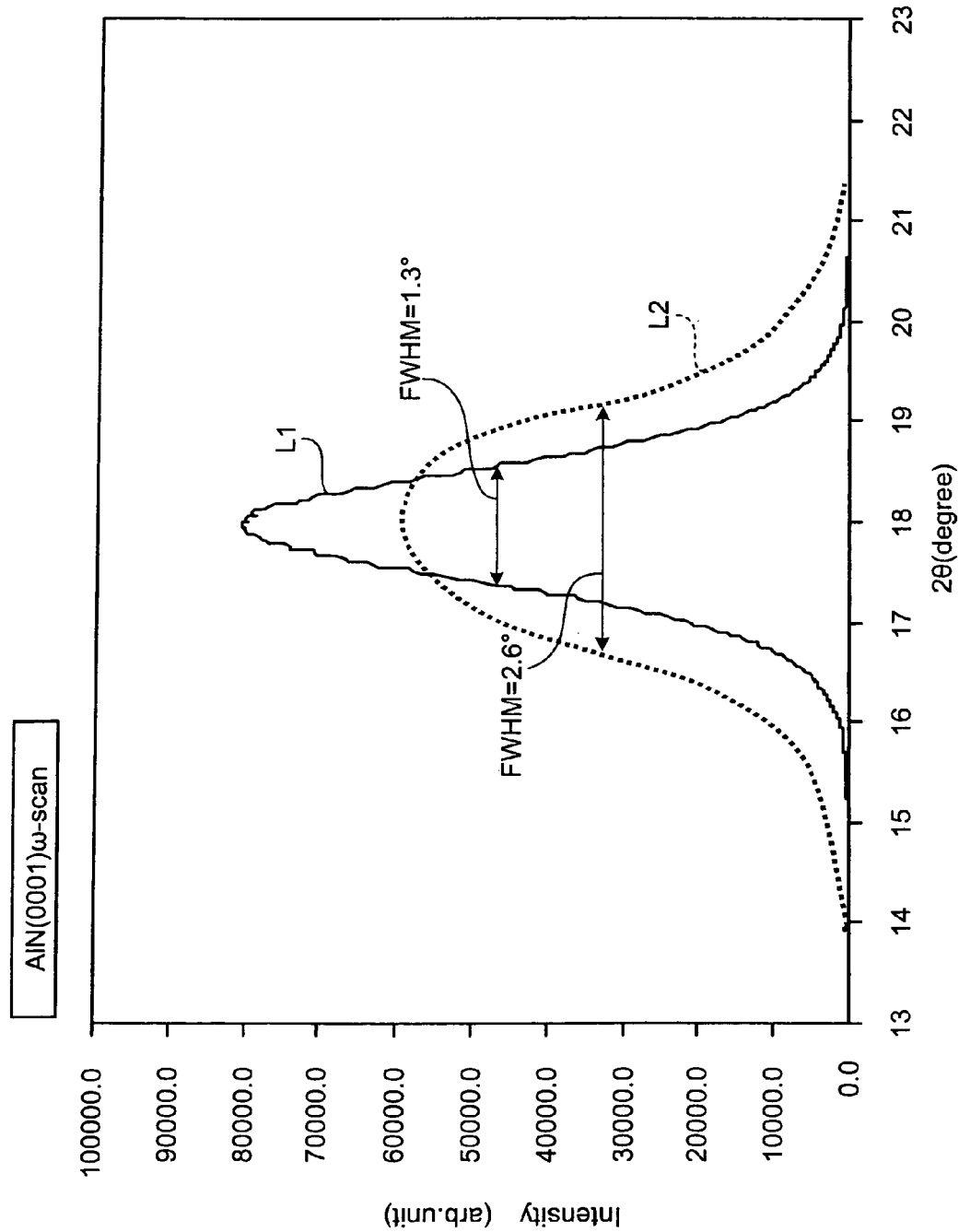

THIN FILM PIEZOELECTRIC RESONATOR AND MANUFACTURING PROCESS THEREOF

CROSS-REFERENCE TO RELATED APPLICATIONS

This application is based upon and claims the benefit of priority from Japanese Patent Application No. 2004-136135, filed on Apr. 30, 2004; the entire contents of which are incorporated herein by reference.

BACKGROUND OF THE INVENTION

1. Field of the Invention

The present invention relates to a thin film piezoelectric resonator, which can be used as a high frequency filter or an RF oscillator, and a method of manufacturing the resonator.

2. Description of the Related Art

Surface acoustic wave (SAW) devices, which have advantages in their high resonance quality factors and their miniaturization, are rapidly developed to be used in filter applications such as LC or dielectric bandpass filters. The SAW device basically has a piezoelectric substrate of single crystal material, and two interdigital transducers located thereon. The resonance frequency of such a SAW device is in inverse proportion to the pitch of an electrode finger of an interdigital transducer. To handle higher frequency signals, the pitch should be reduced. For example, handling more than 1 GHz frequency signals, currently demanded in mobile telecommunication, requires a less than 1 micrometer pitch of the electrode finger. However, such narrow pitch makes it difficult to accurately process the transducers, and causes current leakage and breaking of wire easily when high-power signals enter the transducers.

Thin film piezoelectric resonators overcome the drawback of the SAW devices to handle higher frequency signals. The thin film piezoelectric resonator basically has a piezoelectric film and two electrodes therebetween. The resonance frequencies are determined mainly by a thickness of the piezoelectric film. For example, a film thickness of one to two micrometers brings into a resonance frequency of 2 GHz, and a film thickness of 0.4 to 0.8 micrometer brings into a resonance frequency of 5 GHz. The thin film piezoelectric resonators also make it possible to handle signals up to tens of GHz. The thin film piezoelectric resonator is called a film bulk acoustic resonator (FBAR) or a bulk acoustic wave (BAW) device.

FIGS. 13A to 13D are sectional views of a conventional thin film piezoelectric resonator, showing manufacturing process thereof. To complete the thin film piezoelectric resonator, a lower electrode layer 804 is first patterned on a silicon substrate 800 (FIG. 13A). Next, a piezoelectric layer 815 is deposited to cover the surfaces of the lower electrode layer 804 and the silicon substrate 800 (FIG. 13B). A piezoelectric thin film 805 is patterned by etching the piezoelectric layer 815 (FIG. 13C). As a result of this patterning, a part of the lower electrode layer 804 is exposed. In other words, one of the sides of the piezoelectric thin film 805 is located on the lower electrode layer 804. The other of the sides of the piezoelectric thin film 805 is located on the silicon substrate 800, and therefore a part of the edge of the lower electrode layer 804 is covered. Next, an upper electrode layer 807 is formed on the piezoelectric thin film 805. The upper electrode layer 807 is patterned, extending from a part of the top face of the piezoelectric thin film 805 to the silicon substrate 800 to cover the other of the sides of the piezoelectric thin film 805. Specifically, the piezoelectric thin film 805 also functions to insulate between the lower electrode layer 804 and the upper electrode layer 807. An electrode pad 808a is formed to be electrically connected to the upper electrode layer 807, and an electrode pad 808b is formed to be electrically connected to the exposed part of the lower electrode layer 804. A part of the back face of the silicon substrate 800 is then etched to form a cavity 810 right under the lower electrode layer 804 (FIG. 13D). In the above manner, the thin film piezoelectric resonator 80 is completed.

However, the lower electrode layer 804 is exposed in gas stream for ashing to apply and remove the photoresist in the patterning. In other words, the photolithography and etching processes are needed only to form the lower electrode layer 804. As a result, the surface of the lower electrode layer 804 maintains neither the flatness nor the cleanliness immediately after the deposition process because of, for example, the adsorption of impurities. In addition, since such photolithography process and etching process are usually performed with equipment separate from that for the deposition process, the silicon substrate 800 and the lower electrode layer 804 are exposed to air during moving between these equipment. This exposure causes the adsorption of impurities such as oxygen to the surface of the lower electrode layer 804, so that the flatness and cleanliness are ruined. The surface of the lower electrode layer with low flatness and low cleanliness becomes a redeposition base (S1 in FIG. 13B), which has an adverse affect on the characteristics of the piezoelectric layer 815 deposited thereon. Hence, for example, the film quality, such as the orientation and the polarity of the piezoelectric layer 815, is degraded. Such low film quality causes low quality of a single thin film piezoelectric resonator and uneven quality between thin film piezoelectric resonators.

Japanese Patent Application Laid-Open (JP-A) No. 2002-76824 suggests a piezoelectric thin film resonator whose lower electrode, a piezoelectric thin film and an upper layer electrode can be formed with the same equipment for example.

In JP-A No. 2002-76824, although the patterned lower electrode is shown in drawings, how to pattern the lower electrode and the piezoelectric thin film in the same equipment is not disclosed.

SUMMARY OF THE INVENTION

According to one aspect of the present invention, a thin film piezoelectric resonator includes a substrate having a cavity, and a resonance portion located on the substrate and right above the cavity. The resonance portion includes a lower electrode layer located at a side of the cavity, an upper electrode layer opposite to the lower electrode layer, and a piezoelectric thin film located between the upper electrode layer and the lower electrode layer. A side of the piezoelectric thin film and a side of the lower electrode layer are located in a common plane.

According to another aspect of the present invention, a thin film piezoelectric resonator includes a substrate having a cavity, and a resonance portion located on the substrate and right above the cavity. The resonance portion includes a lower electrode layer located at a side of the cavity, an upper electrode layer opposite to the lower electrode layer, a first piezoelectric thin film located on the lower electrode layer, and a second piezoelectric thin film covering a side of the lower electrode and the first piezoelectric thin film. A side of the first piezoelectric thin film and a side of the lower electrode layer are located in a common plane, and the upper electrode layer is located on a side and a top of the second piezoelectric thin film.

According to still another aspect of the present invention, a thin film piezoelectric resonator includes a substrate having a cavity, and a resonance portion located on the substrate and right above the cavity. The resonance portion includes a lower electrode layer located at a side of the cavity, an upper electrode layer opposite to the lower electrode layer, a first piezoelectric thin film located on the lower electrode layer, and a second piezoelectric thin film covering a top and a first side of the first piezoelectric thin film and a first side of the lower electrode. The first side of the first piezoelectric thin film and the first side of the lower electrode layer are located in a first plane, and a second side of the first piezoelectric thin film and a first side of the second piezoelectric thin film are located in a second common plane.

According to still another aspect of the present invention, a method of manufacturing a thin film piezoelectric resonator includes depositing an electrode material on a substrate; depositing a piezoelectric material on the deposited electrode material; etching the deposited electrode material and the piezoelectric material using a common mask to form a lower electrode layer and a piezoelectric thin film; forming an insulating film to cover a first part of a top of the piezoelectric thin film, a side of the piezoelectric thin film, and a side of the lower electrode layer located in a plane where the side of the piezoelectric thin film is located; forming an upper electrode layer on a second part of the top of the piezoelectric thin film and the insulating film; and forming a cavity right under the lower electrode layer.

According to still another aspect of the present invention, a method of manufacturing a thin film piezoelectric resonator includes depositing an electrode material on a substrate; depositing a piezoelectric material on the deposited electrode material; etching the deposited electrode material and the piezoelectric material using a common mask to form a lower electrode layer and a first piezoelectric thin film; forming a second piezoelectric thin film made of the piezoelectric material to cover a top of the first piezoelectric thin film, a side of the first piezoelectric thin film, and a side of the lower electrode layer located in a plane where the side of the first piezoelectric thin film is located; forming an upper electrode layer on a part of a top of the second piezoelectric thin film; and forming a cavity right under the lower electrode layer.

According to still another aspect of the present invention, a method of manufacturing a thin film piezoelectric resonator includes depositing an electrode material on a substrate; depositing a piezoelectric material on the deposited electrode material; etching the deposited electrode material and the piezoelectric material using a common mask to form a lower electrode layer and a first piezoelectric thin film; depositing the same material as the piezoelectric material to cover a top of the first piezoelectric thin film, a side of the first piezoelectric thin film, and a side of the lower electrode layer located in a plane where the side of the first piezoelectric thin film is located; etching the materials deposited on the first piezoelectric thin film and the lower electrode layer, and a part of the first piezoelectric thin film using a common mask to expose a part of the lower electrode layer, to form a second piezoelectric thin film; forming an upper electrode layer on a top and a side of the second piezoelectric thin film; and forming a cavity right under the lower electrode layer.

BRIEF DESCRIPTION OF THE DRAWINGS

FIG. 3 is a graph of the rocking curve of a piezoelectric thin film obtained by the manufacturing process according to the first embodiment;

DETAILED DESCRIPTION OF THE PREFERRED EMBODIMENTS

Exemplary embodiments of a thin film piezoelectric resonator and a manufacturing process thereof relating to the present invention will be explained in detail below with reference to the accompanying drawings. It should be noted that the drawings are schematic, and size ratios of each portion or between portions therein are not always the same as those of the corresponding real portions.

A thin film piezoelectric resonator according to a first embodiment, characteristically, includes a lower electrode layer and a piezoelectric thin film that are both deposited continuously and patterned with a common mask to form the same shape. Besides, the thin film piezoelectric resonator, characteristically, includes an insulating film that is located on a part of the top face of the piezoelectric thin film, one of the sides of the lower electrode layer, and one of the sides of the piezoelectric thin film in the plane where the one of the sides of the lower electrode layer is located, and includes an upper electrode layer that is located on the surface of the insulating film and a part of the top face of the piezoelectric thin film.

Figure 1:
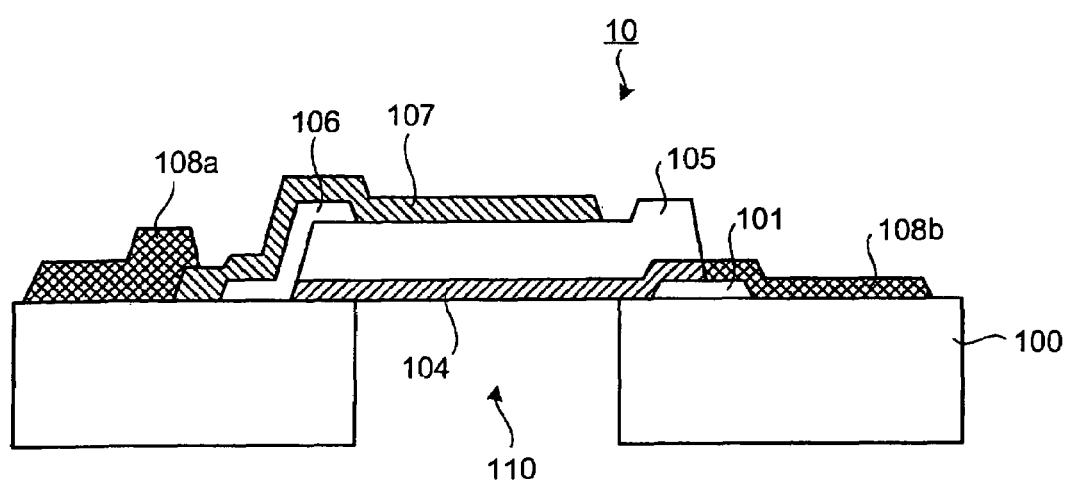
FIG. 1 is a cross section of a thin film piezoelectric resonator according to a first embodiment.

FIG. 1 is a cross section of a thin film piezoelectric resonator according to a first embodiment. A thin film piezoelectric resonator 10 in FIG. 1 has a structure in which a lower electrode layer 104, a piezoelectric thin film 105, and an upper electrode layer 107 are sequentially formed on a silicon substrate 100. On the silicon substrate 100, an electroconductive dummy pad 101 for electrically connecting between the lower electrode layer 104 and an electrode pad 108b is formed. In addition, an insulation film 106 is formed between the lower electrode layer 104 and one of the common sides of the piezoelectric thin film 105 and the upper electrode layer 107. The upper electrode layer 107 extends from a part of the top face of the piezoelectric thin film 105 to the upper surface of the silicon substrate 100 to cover the insulating film 106, and is electrically connected to the electrode pad 108a. The silicon substrate 100 has a cavity 110. A resonance portion, i.e., a structure consisting of the lower electrode layer 104, the piezoelectric thin film 105, and the upper electrode layer 107, lies right above the cavity 110. In other words, the resonance portion closes one of the openings of the cavity 110. The back face of the resonance portion, that is, the back face of the lower electrode layer 104 is exposed in the cavity 110. The cavity 110 is a through hole in the silicon substrate 100 in FIG. 1 but may be a hollow where a part of the silicon substrate 100 right under the lower electrode layer 104 remains. As for the hollow, the resonance portion may be supported by the diaphragm of the silicon substrate 100 without exposing the back face. An insulating film such as an oxide film and a nitride film may be formed over the surface of the silicon substrate 100, and thus the resonance portion may be formed on the formed insulating film.

Figure 2A:
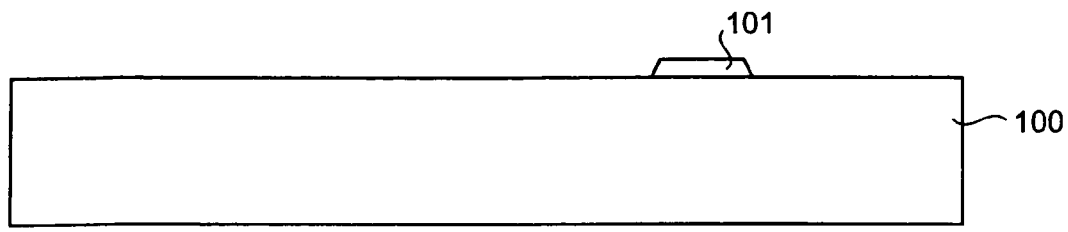
FIGS. 2A to 2G are sectional views of a thin film piezoelectric resonator according to the first embodiment, showing manufacturing process thereof.
Figure 2B:
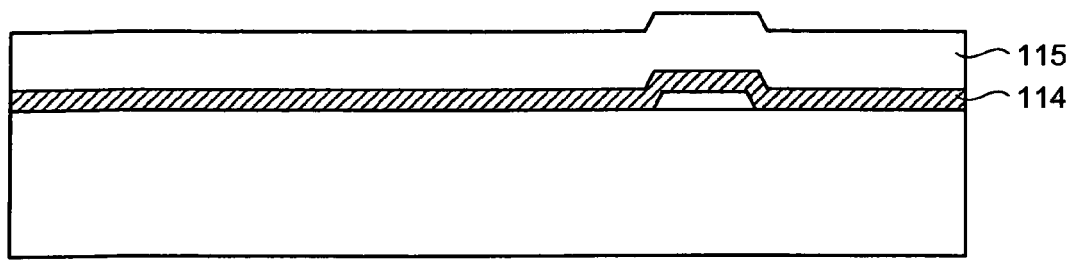

The manufacturing process of the thin film piezoelectric resonator 10 will now be explained below. FIGS. 2A to 2G are sectional views of the thin film piezoelectric resonator 10, showing manufacturing process thereof. A dummy pad 101 is first patterned on the silicon substrate 100 in a well-known photolithography and etching processes (FIG. 2A). An electrode layer 114 is formed by depositing the material of the lower electrode layer 104 over the surface of the silicon substrate 100 to cover the dummy pad 101. After that, the material of piezoelectric thin film 105 is deposited over the surface of the electrode layer 114 to form a piezoelectric layer 115 (FIG. 2B). The electrode layer 114 and the piezoelectric layer 115 are formed in the same deposition equipment. Therefore, there is no patterning process such as exposure in air and photolithography between formations of the electrode layer 114 and the piezoelectric layer 115. The electrode layer 114 is made of, for example, aluminum. The piezoelectric layer 115 is made of, for example, aluminum nitride (AlN). Changing the material of the layers can be achieved only by changing the source material in the deposition equipment such as a sputtering apparatus. The electrode layer 114 may be formed to have a double structure consisting of amolphous and non-amolphous layers, so that the orientation property in the piezoelectric layer 115 formed thereon is improved.

As a result, the surface of the electrode layer 114, even right before the piezoelectric layer 115 is formed, maintains good flatness and cleanliness right after the electrode layer 114 is formed. This means that the electrode layer 114 has little adverse affect on film quality such as the orientation and the polarity of the piezoelectric layer 115 formed thereon. This is because the surface of the electrode layer 114 does not function any longer as the reconstruction base.

Figure 2C:
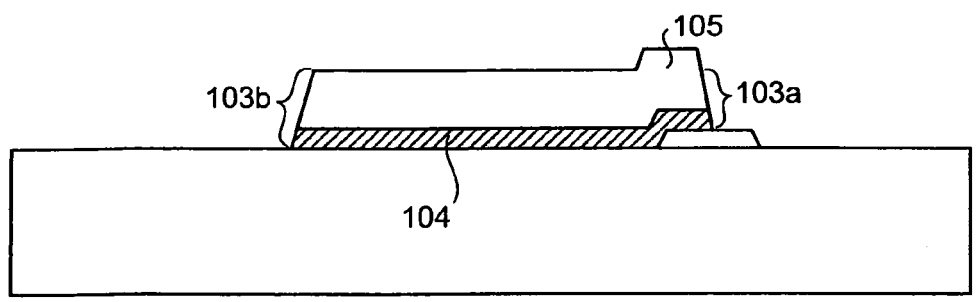

Next, the lower electrode layer 104 and the piezoelectric thin film 105 are formed in a well-known photolithography and etching process (FIG. 2C). Specifically, photoresist is applied to the piezoelectric layer 115, which is then exposed with a photomask having the shape of the piezoelectric thin film 105. After exposing, followed by development process, both the piezoelectric layer 115 and the electrode layer 114 located under the piezoelectric layer 115 are etched. As a result, the sides of the piezoelectric thin film 105 and the lower electrode layer 104 are in the same plane. See sides 103a and 103b shown in FIG. 2C. One of the sides of the lower electrode layer 104 and one of the sides of the piezoelectric thin film 105 which are both located in the same plane are located on the dummy pad 101. In other words, a part of the dummy pad 101 is exposed.

Figure 2D:
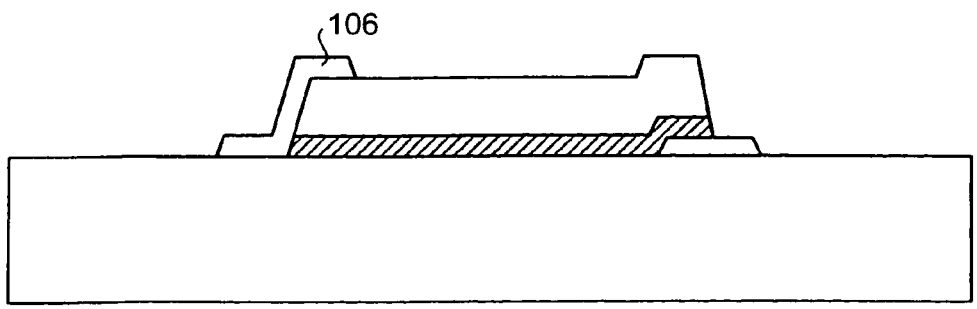

Next, the insulating film 106 is formed to cover one of the sides of the piezoelectric thin film 105 and one of the sides of the lower electrode layer 104 which are both located in the same plane, extending from a part of the top face of the piezoelectric thin film 105 to a part of the surface of the silicon substrate 100 (FIG. 2D). These sides covered with the insulating film 106 are located away from the dummy pad 101. Specifically, insulating material is deposited over the surface of the silicon substrate 100 using, for example, thermal chemical vapor deposition (CVD) equipment to cover the top face of the piezoelectric thin film 105, one of the sides of the piezoelectric thin film 105, and one of the sides of the lower electrode layer 104 in the same plane where the one of the sides is located. The deposited insulating material is patterned in a well-known photolithography and etching process. The insulating material includes, for example, amorphous AlN, silicone oxide ($SiO_2$), or silicone nitride (SiN). Such insulating material allows high quality deposition by CVD with gas source. The thickness of the insulating film is 0.3 micrometer for example. The insulating film 106 functions to insulate between the lower electrode layer 104 and the upper electrode layer 107.

Figure 2E:
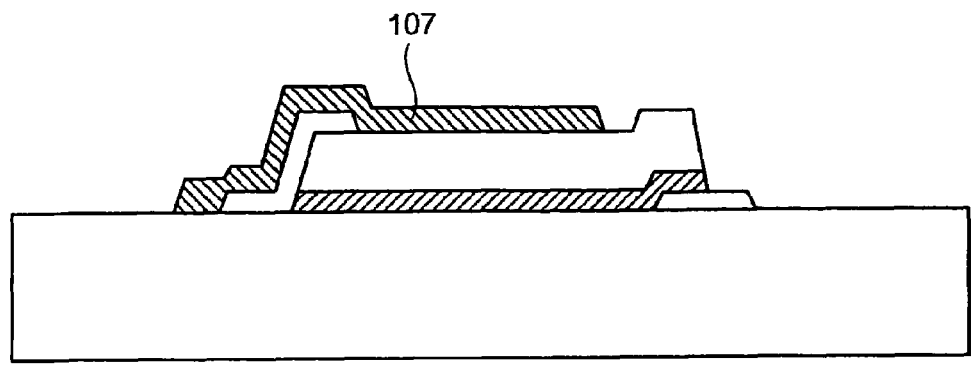
Figure 2F:
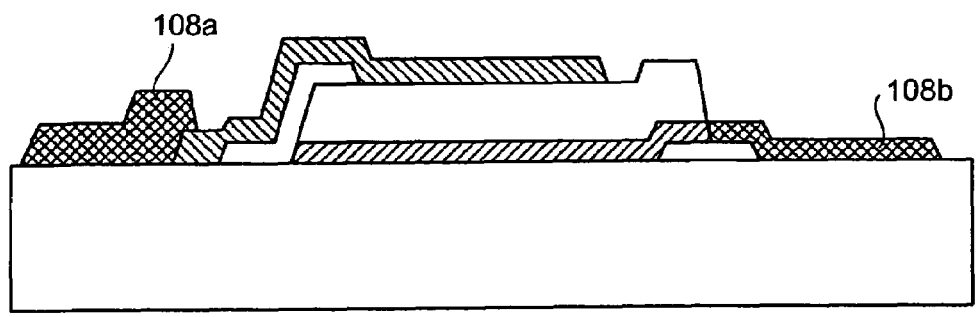

Next, the upper electrode layer 107 is formed to cover the insulating film 106 in a well-known photolithography and etching process, extending from a part of the top face of the piezoelectric thin film 105 to a part of the surface of the silicon substrate 100 (FIG. 2E). In the same manner as this process, the electrode pad 108b, electrically connected to the upper electrode layer 107, and the electrode pad 108a, electrically connected to the lower electrode layer 104 through the dummy pad 101, are formed (FIG. 2F). The electrode pads 108a and 108b are made of, for example, gold (Au) or aluminum (Al).

Figure 2G:
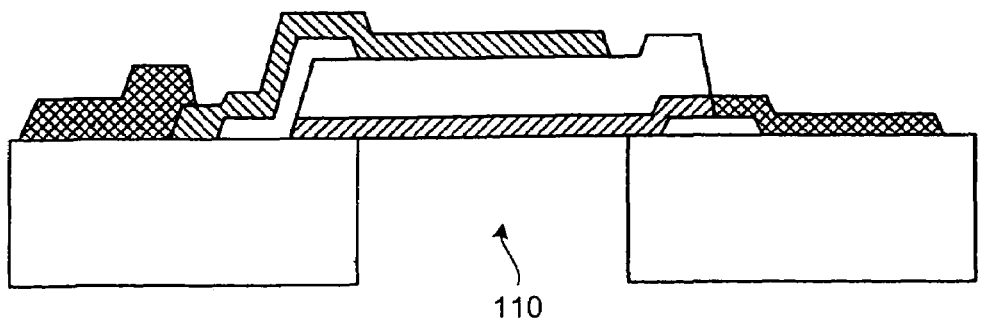

A part of the silicon substrate 100 is removed by the selective etching, such as reactive ion etching (RIE), from the back face of the silicon substrate 100, to form the cavity 110 right under the lower electrode layer 104 (FIG. 2G). The cavity 110 is a through hole in the silicon substrate 100 in FIG. 1 but may be a hollow where a part of the silicon substrate 100 is a diaphragm.

Figure 4:
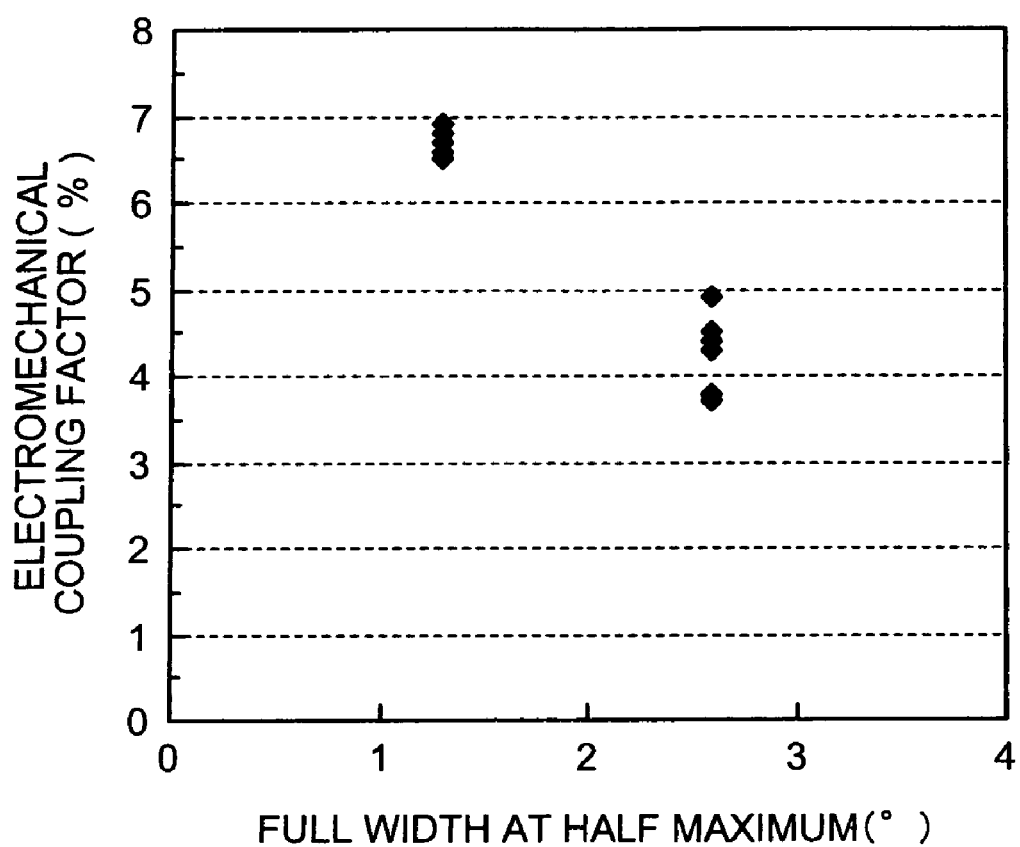
FIG. 4 is a graph of the electromechanical coupling factor of a piezoelectric thin film obtained by the manufacturing process according to the first embodiment.

FIG. 3 is a graph of the rocking curve of a piezoelectric thin film obtained by the manufacturing process according to the first embodiment. FIG. 4 is a graph of the electromechanical coupling factor of a piezoelectric thin film obtained by the manufacturing process according to the first embodiment. In the thin film piezoelectric resonator used to obtain the measurement results, the lower electrode has a thickness of 250 nanometers, and the piezoelectric thin film had a thickness of 1700 nanometers. The orientation of the piezoelectric thin film obtained by the manufacturing process according to the first embodiment could be controlled so that a full width at half maximum (FWHM) of the rocking curve of X rays becomes about 1.3°, as shown by solid line L1 in FIG. 3. By contrast, the orientation of the piezoelectric thin film of a conventional thin film piezoelectric resonator showed a FWHM of about 2.6° as shown by dotted line L2. Since the piezoelectric thin film obtained by the first embodiment had the orientation of an FWHM of 1.3°, its electromechanical coupling factor was as large as 6.7% as shown in FIG. 4. By contrast, the electromechanical coupling factor of the conventional thin film piezoelectric resonator was 5.0% or less as shown in FIG. 4. It is known that the larger the electromechanical coupling factor of the piezoelectric thin film, the broader the resonance frequency band, in the thin film piezoelectric resonator. Moreover, the thin film piezoelectric resonator according to the first embodiment had a Q factor of about 800, which determines the resonance characteristics. These measurement results show that the piezoelectric thin film of the thin film piezoelectric resonator according to the first embodiment has excellent film quality, compared with that of the conventional thin film piezoelectric resonator. The reason of such excellent results is that the flatness and the cleanliness of the surface of the lower electrode layer 104 have been maintained, and the orientation of the piezoelectric thin film 105 has been controlled almost as designed.

As described above, according to the manufacturing process of the thin film piezoelectric resonator in the first embodiment, since the lower electrode layer 104 and the piezoelectric thin film 105 can be formed continuously in the same equipment, it is possible to deposit the piezoelectric thin film 105 without ruining the flatness and the cleanliness of the surface of the lower electrode layer 104. As a result, the piezoelectric thin film 105 having excellent film quality can be obtained, it is therefore possible to provide the thin film piezoelectric resonator 10 of low cost, high yields, and high resonance factor.

The dummy pad 101 may be omitted if the lower electrode layer 104 and the electrode pad 108b are electrically connected to each other by other means or manner. For example, the piezoelectric thin film 105 may be etched again to expose a part of the lower electrode layer 104 after the lower electrode layer 104 and the piezoelectric thin film 105 are formed in the same etching process (FIG. 2C). In this case, the electrode pad 108b is formed to cover a part of the exposed lower electrode layer 104.

A thin film piezoelectric resonator according to a second embodiment is characterized in that the insulating film that insulates between the upper electrode layer and the lower electrode layer are formed only on one of the sides of the piezoelectric thin film, one of the sides of the lower electrode layer in the same plane where the one of the sides of the piezoelectric thin film is located, and a part of the silicon substrate. In other words, a part of the insulating film 106 shown in FIG. 1, formed on the piezoelectric thin film 105 is removed.

Figure 5:
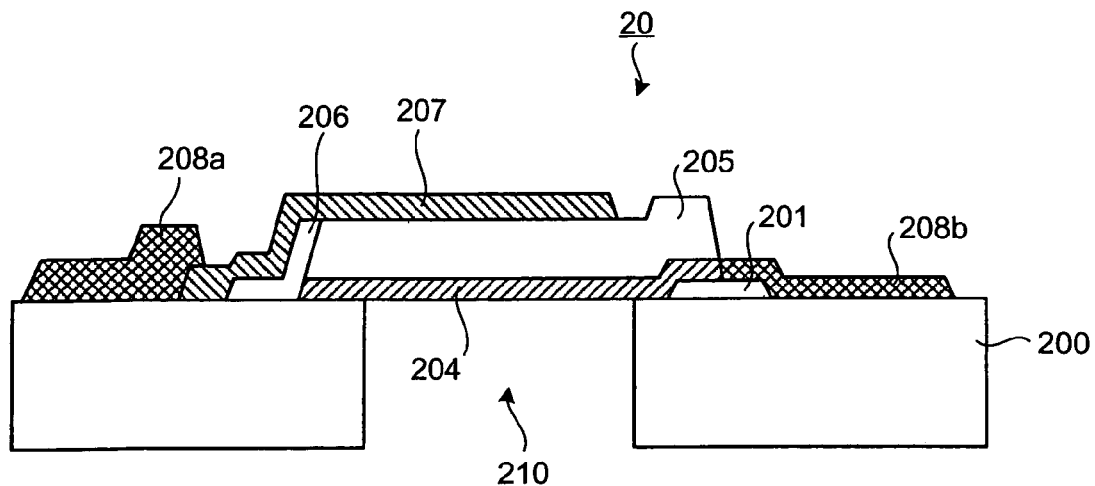
FIG. 5 is a cross section of a thin film piezoelectric resonator according to a second embodiment.

FIG. 5 is a cross section of a thin film piezoelectric resonator according to a second embodiment. As for a silicon substrate 200 in FIG. 5, a dummy pad 201, a lower electrode layer 204, a piezoelectric thin film 205, electrode pads 208a and 208b, and a cavity 210 correspond to the silicon substrate 100, the dummy pad 101, the lower electrode layer 104, the piezoelectric thin film 105, the electrode pads 108a and 108b, and the cavity 110 shown in FIG. 1, respectively. The silicon substrate 200 is manufactured by the same manner as that in the first embodiment.

FIG. 5 differs from FIG. 1 in that the top face of the piezoelectric thin film 105 is not covered with the insulating film 206 that insulates between the upper electrode layer 207 and the lower electrode layer 204. The process of forming the insulating film 206 is as follows. An insulating film is first formed to cover one of the sides of the piezoelectric thin film 205 and one of the sides of the lower electrode layer 204 which are both located in the same plane, extending from a part of the top face of the piezoelectric thin film 205 to a part of the surface of the silicon substrate 20, as shown in FIG. 2D. Next, a part of the insulating film formed partially on the piezoelectric thin film 205 (i.e., prominent portion) is removed by the dry etching. As a result, the insulating film 206 is formed only on one of the sides of the lower electrode layer 204, one of the sides of the piezoelectric thin film 205 in the same plane where the one of the sides of the piezoelectric thin film 205 is located, and a part of the silicon substrate 200. Next, the upper electrode layer 207 is formed to cover the insulating film 206. The upper electrode layer 207 does not have a convex portion as shown in FIG. 1 at a position where a part of the insulating film 206 covers the top face of the piezoelectric thin film 205. Therefore, the series resistance components of the upper electrode layer 207 is smaller than that of the upper electrode layer 107 shown in FIG. 1. Although the inventor(s) found the series resistance components have an adverse affect on the Q factor of the thin film piezoelectric resonator, the thin film piezoelectric resonator 20 according to the second embodiment had a Q factor of about 1000. This means the structure as shown in FIG. 5 has a resonant factor more excellent than that of the thin film piezoelectric resonator 10 according to the first embodiment.

The insulating film 206 may be deposited selectively on one of the common planes of the lower electrode layer 204 and the piezoelectric thin film 205 and a part of the silicon substrate 200.

As described above, according to the manufacturing process of the thin film piezoelectric resonator in the second embodiment, since there is no convex portion on the upper electrode layer 207 covering the insulating layer 206, it is possible to reduce the series resistance components of the upper electrode layer 207 by the components attribute to convex portion. As a result, the resonance factor of the thin film piezoelectric resonator 20 can be improved.

A thin film piezoelectric resonator according to a third embodiment, characteristically, includes a lower electrode layer and a first piezoelectric thin film that are both deposited continuously and patterned with a common mask to form the same shape, and also includes a second piezoelectric thin film that covers the first piezoelectric thin film.

Figure 6:
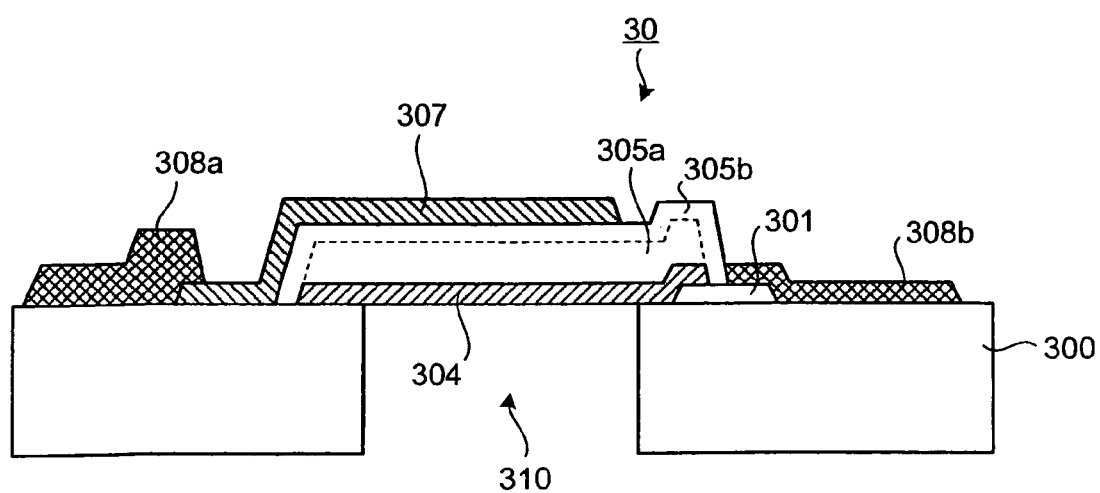
FIG. 6 is a cross section of a thin film piezoelectric resonator according to a third embodiment.

FIG. 6 is a cross section of a thin film piezoelectric resonator according to a third embodiment. A thin film piezoelectric resonator 30 in FIG. 6 has a structure in which a lower electrode layer 304, a first piezoelectric thin film 305a, a second piezoelectric thin film 305b, and an upper electrode layer 307 are sequentially formed on a silicon substrate 300. On the silicon substrate 300, an electroconductive dummy pad 301 for electrically connecting between the lower electrode layer 304 and an electrode pad 308b is formed. The sides of the lower electrode layer 304 and the sides of the first piezoelectric thin film 305a are located in the same plane. The second piezoelectric thin film 305b is formed to cover the top face of the first piezoelectric thin film 305a, one of the sides of the first piezoelectric thin film 305a, and one of the sides of the lower electrode layer 304 in the same plane where the one of the sides of the first piezoelectric thin film 305a is located. The upper electrode layer 307 extends from a part of the top face of the second piezoelectric thin film 305b to the upper surface of the silicon substrate 300 to cover the second piezoelectric thin film 305b, and is electrically connected to the electrode pad 308a. The silicon substrate 300 has a cavity 310. A resonance portion, i.e. a structure consisting of the lower electrode layer 304, the first piezoelectric thin film 305a, the second piezoelectric thin film 305b, and the upper electrode layer 307, lies right above the cavity 310. The cavity 310 may be a hollow where the resonance portion is supported by the diaphragm of the silicon substrate 300.

The manufacturing process of the thin film piezoelectric resonator 30 will now be explained below. FIGS. 7A to 7G are sectional views of the thin film piezoelectric resonator 30, showing manufacturing process thereof. The processes in FIGS. 7A to 7C correspond to FIGS. 2A to 2C, respectively. Therefore, the sides of the first piezoelectric thin film 305a are located in the same plane where the sides of the lower electrode layer 304 are located. For example, the sides of the lower electrode layer 304 and the first piezoelectric thin film 305a that are located on the dummy pad 301 are located in a plane 303a. In other words, a part of the dummy pad 301 is exposed. The sides of the lower electrode layer 304 and the first piezoelectric thin film 305a that are located on the other side of the dummy pad 301 are located in a plane 303b.

Figure 7A:
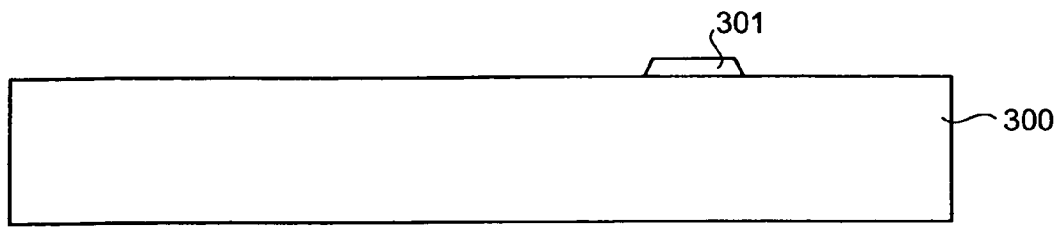
FIGS. 7A to 7G are sectional views of a thin film piezoelectric resonator according to the third embodiment, showing manufacturing process thereof.
Figure 7B:
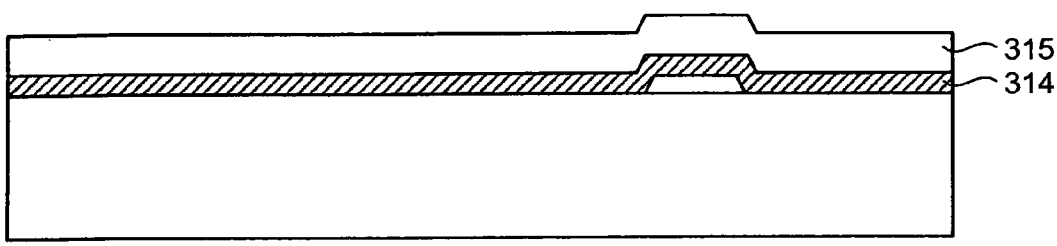
Figure 7C:
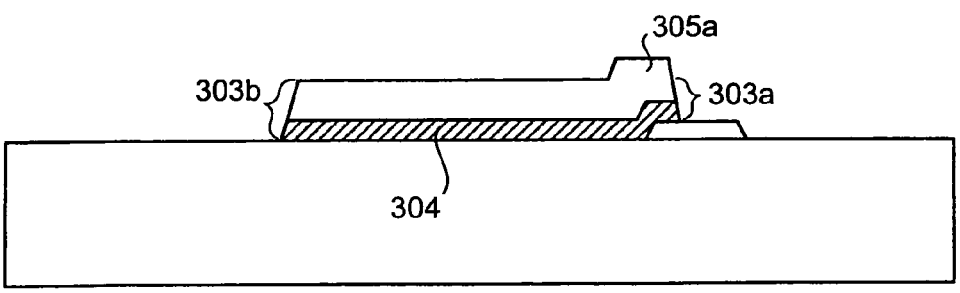
Figure 7D:
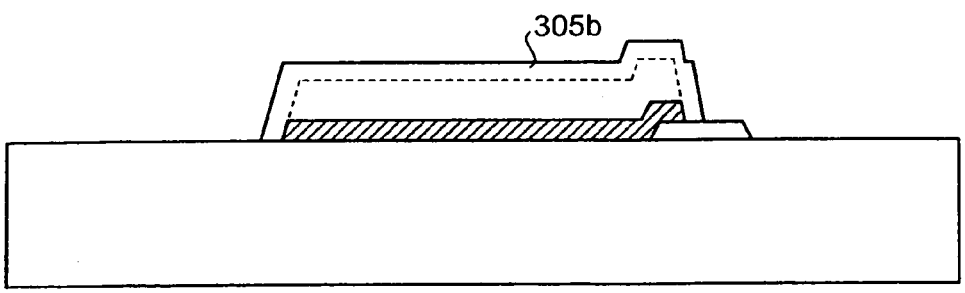

In the manufacturing process of the thin film piezoelectric resonator 30, the second piezoelectric thin film 305b is patterned to cover the top face of the first piezoelectric thin film 305a, the sides of the first piezoelectric thin film 305a, and the sides of the lower electrode layer 304 (FIG. 7D). As a result, one of the sides of the second piezoelectric thin film 305b comes in contact with the silicon substrate 300, and other one of the sides of the second piezoelectric thin film 305b is located on the dummy pad 301. The second piezoelectric thin film 305b is formed by using the same material as the first piezoelectric thin film 305a, for example, aluminum nitride (AlN). The second piezoelectric thin film 305b functions to insulate between the upper electrode layer 307 and the lower electrode layer 304. The second piezoelectric thin film 305b is also thinner than the first piezoelectric thin film 305a. To improve film quality of the first piezoelectric thin film 305a, the lower electrode layer 304 and the first piezoelectric thin film 305a are patterned after they are deposited continuously in the same equipment, as well as the lower electrode layer 104 and the piezoelectric thin film 105 described in the first embodiment. Therefore, neither the flatness nor the cleanliness in the surface of the first piezoelectric thin film 305a are more excellent than the surface of the lower electrode layer 104. Therefore, some film quality of the second piezoelectric thin film 305b are inferior to that of the first piezoelectric thin film 305a. It is preferable that the second piezoelectric thin film 305b be thin to the extent of no adverse affect on the resonance factor of the thin film piezoelectric resonator 30. For example, the first piezoelectric thin film 305a has a thickness of 1200 nanometers, and the second piezoelectric thin film 305b has a thickness of 500 nanometers.

Figure 7E:
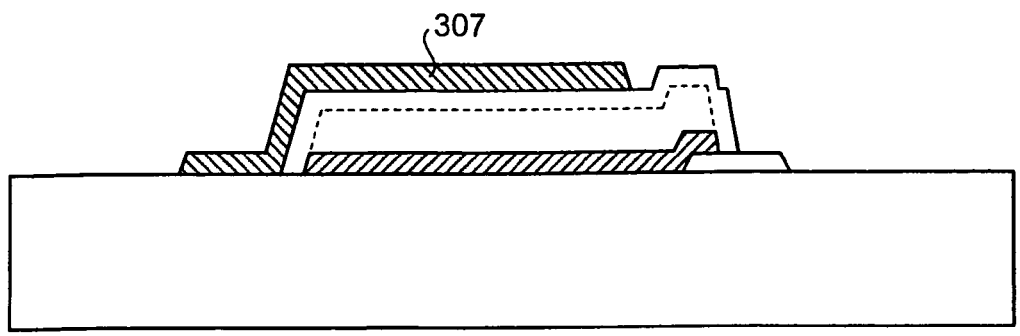
Figure 7F:
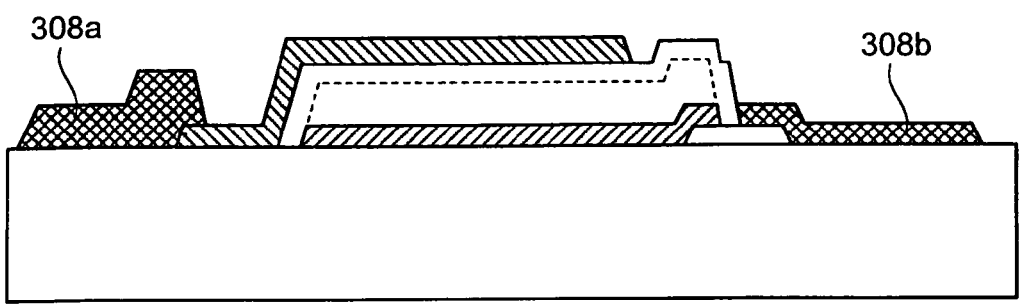
Figure 7G:
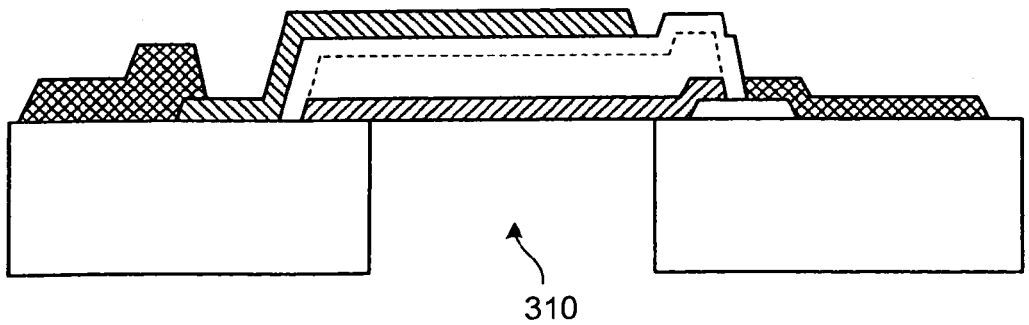

Next, the upper electrode layer 307 is formed to cover the side of the second piezoelectric thin film 305b located in the other side of the dummy pad 301 in a well-known photolithography and etching process, extending from a part of the top face of the second piezoelectric thin film 305b to a part of the surface of the silicon substrate 300 (FIG. 7E). After that, the electrode pads 308a and 308b, and the cavity 310 are formed in the same manner as that shown in FIGS. 2F and 2G (FIGS. 7F and 7G).

Upon measurement, the thin film piezoelectric resonator 30 obtained by the manufacturing process according to the third embodiment had an electromechanical coupling factor of 6.5% and a Q factor of 800.

As described above, according to the manufacturing process of the thin film piezoelectric resonator in the third embodiment, since the lower electrode layer 304 and the first piezoelectric thin film 305a can be formed continuously in the same equipment, it is possible to deposit the first piezoelectric thin film 305a without ruining the flatness and the cleanliness of the surface of the lower electrode layer 304. In addition, the second piezoelectric thin film 305b, which is formed to cover the first piezoelectric thin film 305a, can function as an insulating film to insulate between the upper electrode layer 307 and the lower electrode layer 304.

A thin film piezoelectric resonator according to a fourth embodiment is characterized in that one of the sides of the second piezoelectric thin film of the thin film piezoelectric resonator according to the third embodiment is located in the same plane where one of the sides of the first piezoelectric thin film is located.

Figure 8:
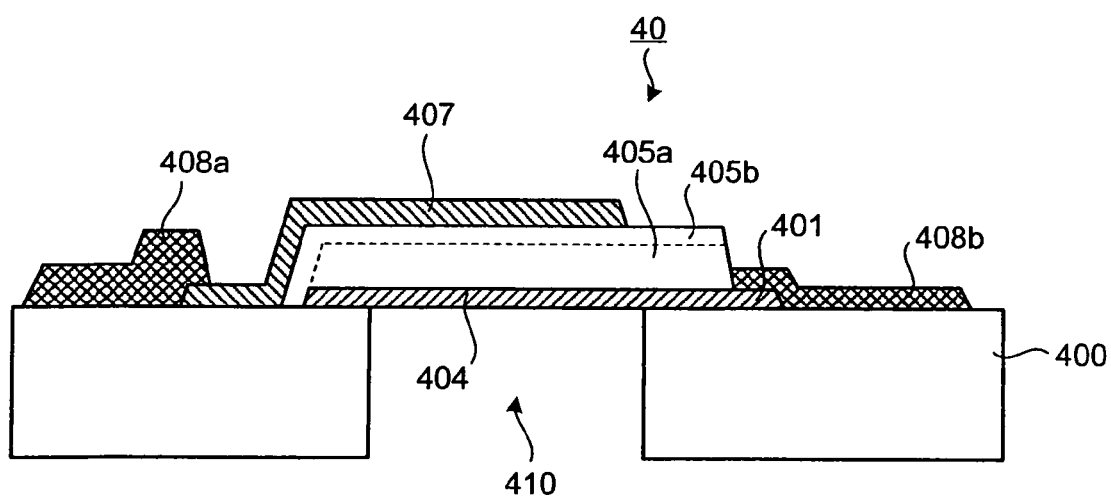
FIG. 8 is a cross section of a thin film piezoelectric resonator according to a fourth embodiment.

FIG. 8 is a cross section of a thin film piezoelectric resonator according to a fourth embodiment. A thin film piezoelectric resonator 40 in FIG. 8 has a structure in which a lower electrode layer 404, a first piezoelectric thin film 405a, a second piezoelectric thin film 405b, and an upper electrode layer 407 are sequentially formed on a silicon substrate 400. The sides of the lower electrode layer 404 and the first piezoelectric thin film 405a are located in the same plane. The second piezoelectric thin film 405b is formed to cover the top face of the first piezoelectric thin film 405a, one of the sides of the first piezoelectric thin film 405a, and one of the sides of the lower electrode layer 404. The upper electrode layer 407 extends from a part of the top face of the first piezoelectric thin film 405a to the upper surface of the silicon substrate 400 to cover the second piezoelectric thin film 405b, and is electrically connected to the electrode pad 408a. The silicon substrate 400 has a cavity 410. A resonance portion, i.e. a structure consisting of the lower electrode layer 404, the first piezoelectric thin film 405a, the second piezoelectric thin film 405b, and the upper electrode layer 407, lies right above the cavity 410. The cavity 410 may be a hollow such that the resonance portion is supported by the diaphragm of the silicon substrate 400.

Figure 9A:
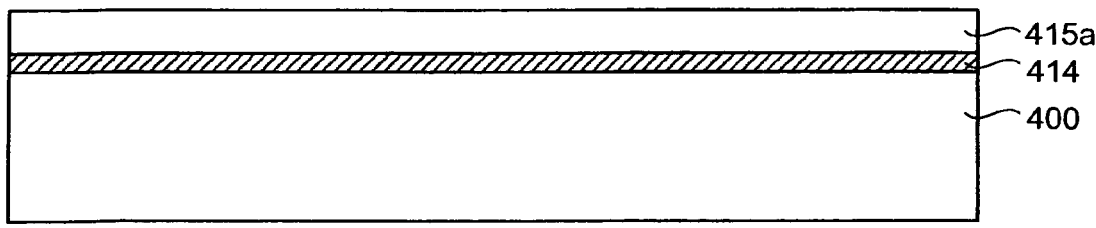
FIGS. 9A to 9G are sectional views of a thin film piezoelectric resonator according to the fourth embodiment, showing manufacturing process thereof.

The manufacturing process of the thin film piezoelectric resonator 40 will now be explained below. FIGS. 9A-9G are sectional views of the thin film piezoelectric resonator 40, showing manufacturing process thereof. An electrode layer 414 is formed by depositing the material of the lower electrode layer 404 over the surface of the silicon substrate 400. After that, the material of the first piezoelectric thin film 405a is deposited over the surface of the electrode layer 414 to form a piezoelectric layer 415a (FIG. 9A). Specifically, this process has the same advantages as that of the process shown in FIG. 2B.

Figure 9B:
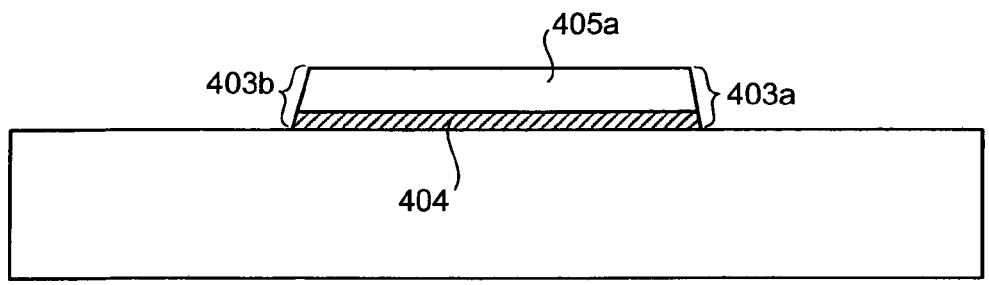

The lower electrode layer 404 and the first piezoelectric thin film 405a are patterned in the same manner as that shown in FIG. 2C (FIG. 9B). Therefore, the sides of the first piezoelectric thin film 405a are located in the same planes where the sides of the lower electrode layer 404 are located, respectively. For example, one of the sides of the lower electrode layer 404 and one of the sides of the first piezoelectric thin film 405a are located in a plane 403a. Other one of the sides of the lower electrode layer 404 and other one of sides of the first piezoelectric thin film 405a are located in a plane 403b.

Figure 9C:
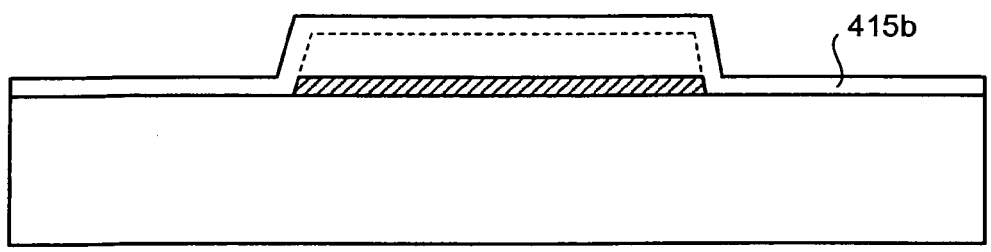
Figure 9D:
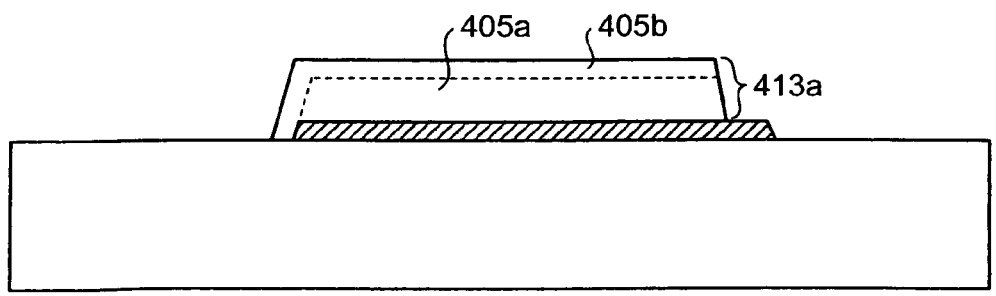

Next, the material of the second piezoelectric thin film 405b is deposited over the silicon substrate 400 to cover the top face of the first piezoelectric thin film 405a, the sides of the first piezoelectric thin film 405a, and the sides of the lower electrode layer 404, to form a piezoelectric layer 415b (FIG. 9C). The second piezoelectric thin film 405b is patterned in a well-known photolithography and etching process (FIG. 9D). In this etching process, not only the piezoelectric layer 415b but also a part of the first piezoelectric thin film 405a is etched. Specifically, photoresist is applied to the piezoelectric layer 415b, which is then exposed with a photomask having the shape of the piezoelectric thin film 405b. After exposing, followed by development process, both the piezoelectric layer 415b and a part of the first piezoelectric thin film 405a located under the piezoelectric layer 415b are etched. As a result, one of the sides of the second piezoelectric thin film 405b and one of the sides of the first piezoelectric thin film 405a are located in a plane 413a whose one edge is located on the lower electrode layer 404. Other one of the sides of the second piezoelectric thin film 405b comes in contact with the silicon substrate 300. In other words, a part of the lower electrode layer 404 is exposed. The function, the material, and the thickness, of the second piezoelectric thin film 405b are the same as those of the second piezoelectric thin film 305b described in the third embodiment. In the manufacturing process of the thin film piezoelectric resonator 40 according to the fourth embodiment, since a part of the lower electrode layer 404 is exposed, the dummy pad as shown in FIG. 1, FIG. 5, or FIG. 6 is unnecessary.

Figure 9E:
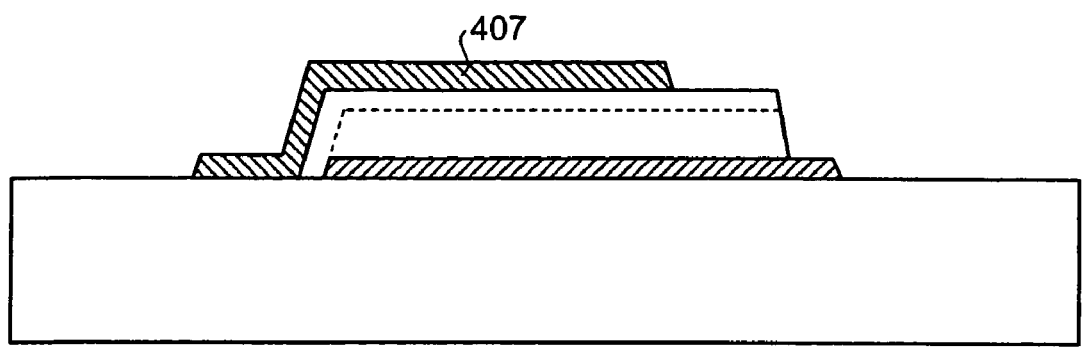
Figure 9F:
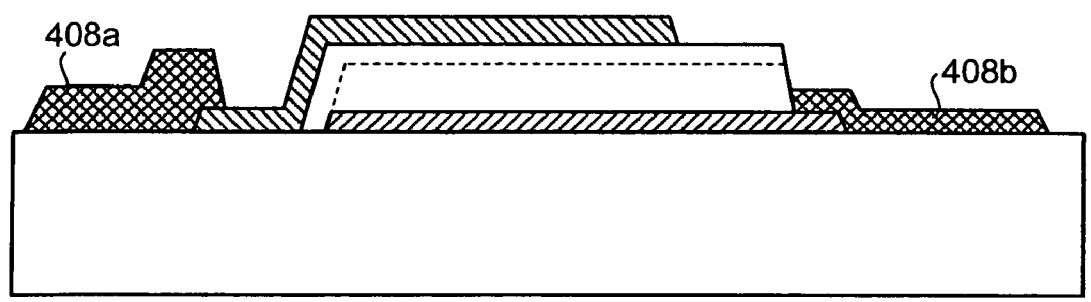
Figure 9G:
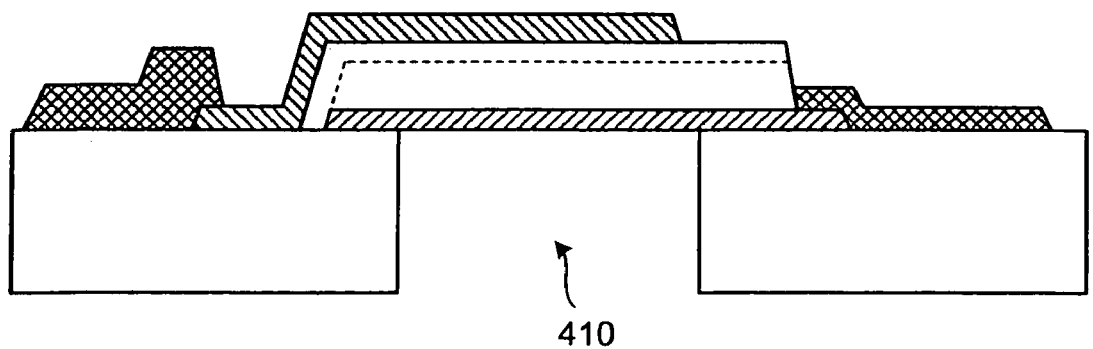

After that, the upper electrode layer 407, the electrode pads 408a and 408b, and the cavity 410 are formed in the same manner as that shown in FIGS. 7E to 7G (FIGS. 9E to 9G). A part of the electrode pad 408b is formed on the lower electrode layer 404 exposed by the process shown in FIG. 9D.

As described above, according to the manufacturing process of the thin film piezoelectric resonator in the fourth embodiment, since the lower electrode layer 404 and the first piezoelectric thin film 405a can be formed continuously in the same equipment, it is possible to form the first piezoelectric thin film 405a having excellent film quality, as well as the first embodiment. In addition, the second piezoelectric thin film 305b, which is formed to cover the first piezoelectric thin film 305a, can function as an insulating film to insulate between the upper electrode layer 307 and the lower electrode layer 304. As a result, the second piezoelectric thin film 405b functions as an insulating film to insulate between the upper electrode layer 407 and the lower electrode layer 404, and the process of forming the dummy pad as shown in FIG. 1, FIG. 5, or FIG. 6 becomes unnecessary.

Figure 10:
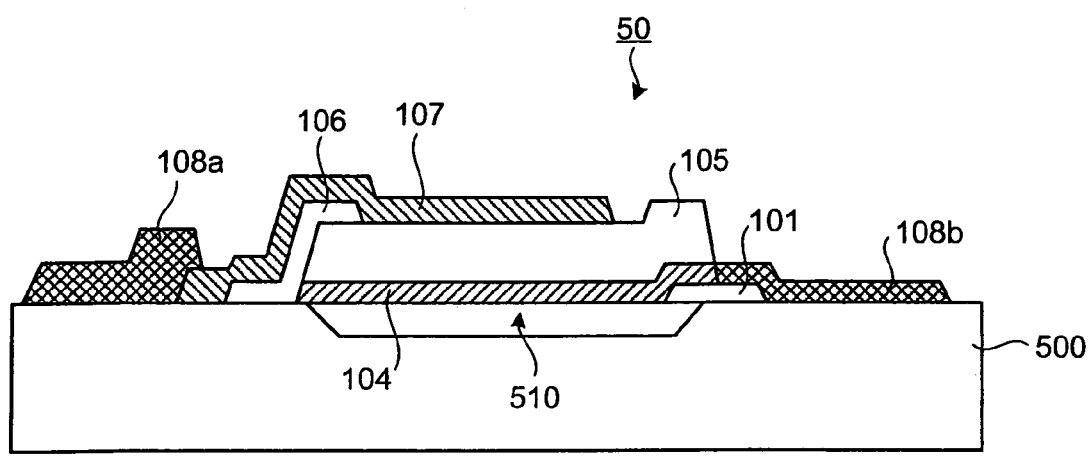
FIG. 10 is a cross section of a modification of the thin film piezoelectric resonator according to the first embodiment.

Although a thin film piezoelectric resonator according to the present invention has a characteristic resonance portion, the cavity located right under the resonance portion can be formed by a well-known process. Although the cavity, whose longitudinal section is rectangular, formed by the selective etching is shown in FIG. 1, FIG. 5, FIG. 6, and FIG. 8, the cavity may have slopes formed by the anisotropic wet etching. For example, a thin film piezoelectric resonator 50 shown in FIG. 10 has a silicon substrate 510 having a cavity 510 formed thereon in place of the silicon substrate 100 of the thin film piezoelectric resonator 10 shown in FIG. 1. This cavity 510 is formed by forming a sacrificial layer in a hollow formed on the substrate, forming the resonance portion on the sacrificial layer, and then removing the sacrificial layer by the selective wet etching.

Figure 11:
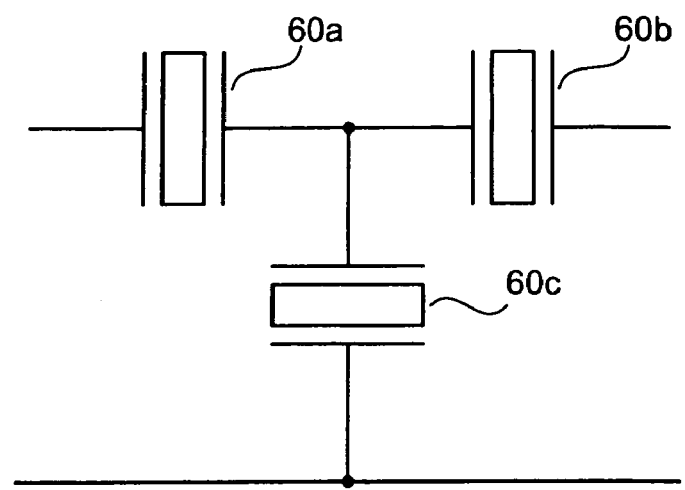
FIG. 11 is an equivalent circuit diagram of a high frequency filter with a thin film piezoelectric resonator according to the present invention.

A thin film piezoelectric resonator according to the present invention can be used as, for example, a high frequency filter or an RF oscillator. FIG. 11 is an equivalent circuit diagram of a high frequency filter with a thin film piezoelectric resonator according to the present invention. A high frequency filter has a ladder structure consisting of thin film piezoelectric resonators 60a and 60b which are in series with each other and thin film piezoelectric resonator 60c which is in parallel, as shown in FIG. 11. The high frequency filter functions as, for example, a bandpass filter, when the center frequencies of the thin film piezoelectric resonators 60a and 60b are slightly shifted from the center frequency of the thin film piezoelectric resonator 60c, and the resonance frequencies of the thin film piezoelectric resonators 60a and 60b are matched with the antiresonant frequency of the thin film piezoelectric resonator 60c.

Figure 12:
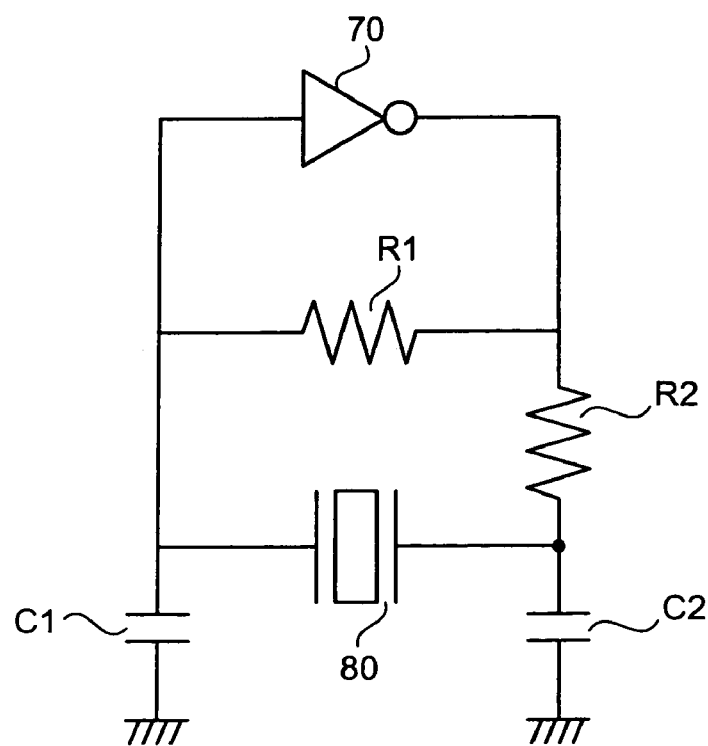
FIG. 12 is an equivalent circuit diagram of a high frequency oscillator with a thin film piezoelectric resonator according to the present invention.
Figure 13A:
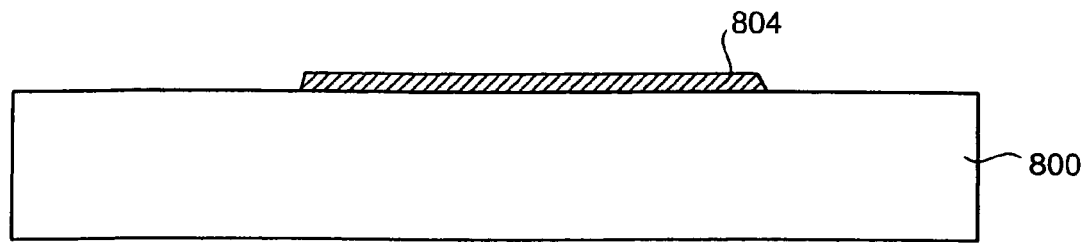
FIGS. 13A to 13D are sectional views of a conventional thin film piezoelectric resonator, showing manufacturing process thereof.
Figure 13B:
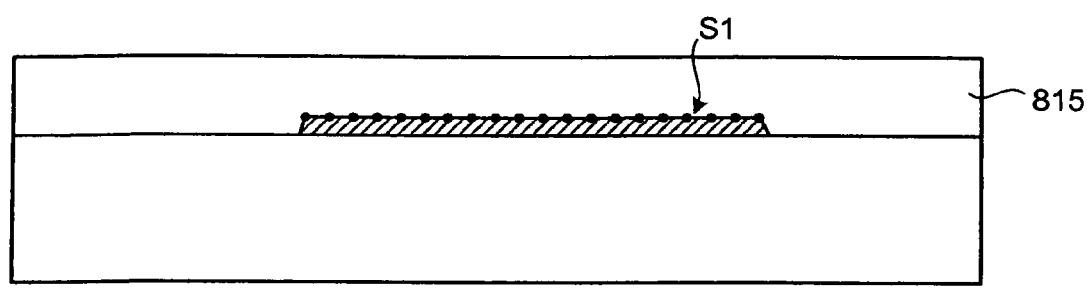
Figure 13C:
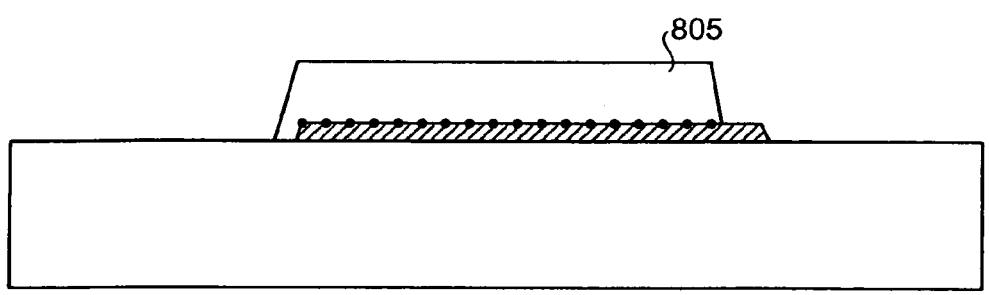
Figure 13D:
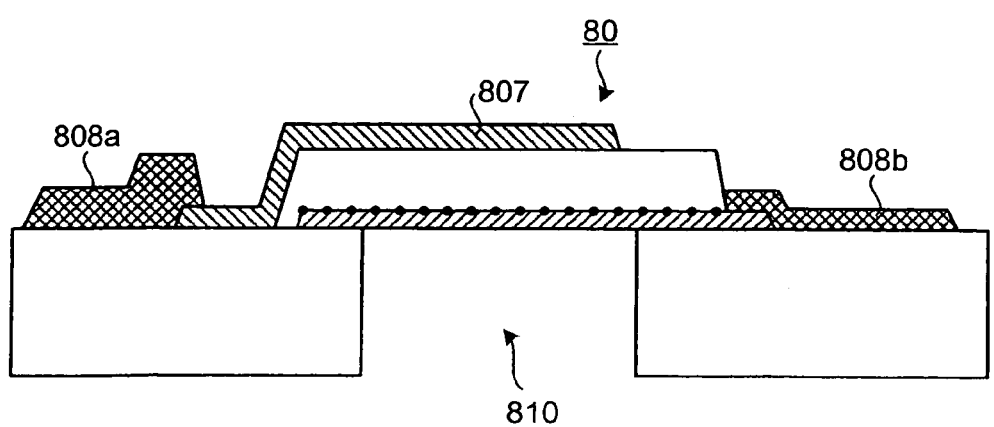

FIG. 12 is an equivalent circuit diagram of a high frequency oscillator with a thin film piezoelectric resonator according to the present invention. The high frequency oscillator includes a thin film piezoelectric resonator 80, a feedback resistor R1, a damping resistor R2, load capacitors C1 and C2, and a CMOS inverter amplifier 70 as shown in FIG. 12. This high frequency oscillator is useful as a voltage controlled oscillator used for mobile communication devices.

Moreover, a thin film piezoelectric resonator according to the present invention can enjoy all of the advantages of well-known thin film piezoelectric resonators. The thin film piezoelectric resonator, for example, which has a resonance portion formed on a semiconductor substrate, can be integrated on the same semiconductor substrate with other semiconductor circuits such as transistors and ICs.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A thin film piezoelectric resonator, comprising:
a substrate having a cavity; and
a resonance portion located on the substrate and right above the cavity,
wherein the resonance portion includes a lower electrode layer, an upper electrode layer opposite to the lower electrode layer, a first piezoelectric thin film located on the lower electrode layer, and a second piezoelectric thin film covering a side of the lower electrode and a top and a side of the first piezoelectric thin film,
wherein a side of the first piezoelectric thin film and a side of the lower electrode layer are located in a common plane, and the upper electrode layer is located on a side and a part of a top of the second piezoelectric thin film.

2. The thin film piezoelectric resonator according to claim 1, wherein the second piezoelectric thin film has a thickness smaller than that of the first piezoelectric thin film.

3. The thin film piezoelectric resonator according to claim 1, further comprising a conductive layer located on the substrate,
wherein a part of the lower electrode layer is located on the conductive layer.

4. The thin film piezoelectric resonator according to claim 3, further comprising an electrode pad located on the substrate,
wherein a part of the electrode pad is located on the conductive layer.

5. The thin film piezoelectric resonator according to claim 1, wherein the cavity is a hole penetrated from a surface of the substrate to another surface thereof.

6. The thin film piezoelectric resonator according to claim 1, wherein the cavity is a hollow formed at a surface of the substrate.

7. A thin film piezoelectric resonator, comprising:
a substrate having a cavity; and
a resonance portion located on the substrate and right above the cavity,
wherein the resonance portion includes a lower electrode layer, an upper electrode layer opposite to the lower electrode layer, a first piezoelectric thin film located on the lower electrode layer, and a second piezoelectric thin film covering a top and a first side of the first piezoelectric thin film and a first side of the lower electrode,
wherein the first side of the first piezoelectric thin film and the first side of the lower electrode layer are located in a first common plane, and a second side of the first piezoelectric thin film and a first side of the second piezoelectric thin film are located in a second common plane.

8. The thin film piezoelectric resonator according to claim 7, wherein the second piezoelectric thin film has a thickness smaller than that of the first piezoelectric thin film.

9. The thin film piezoelectric resonator according to claim 7, further comprising a conductive layer located on the substrate,
wherein a part of the lower electrode layer is located on the conductive layer.

10. The thin film piezoelectric resonator according to claim 7, wherein the cavity is a hole penetrated from a surface of the substrate to another surface thereof.

11. The thin film piezoelectric resonator according to claim 7, wherein the cavity is a hollow formed at a surface of the substrate.

* * * * *